United States Patent [19]
Bran

[11] Patent Number: 5,556,479
[45] Date of Patent: Sep. 17, 1996

[54] METHOD AND APPARATUS FOR DRYING SEMICONDUCTOR WAFERS

[75] Inventor: Mario E. Bran, Garden Grove, Calif.

[73] Assignee: Verteq, Inc., Santa Ana, Calif.

[21] Appl. No.: 275,807

[22] Filed: Jul. 15, 1994

[51] Int. Cl.[6] .................................................. B08G 3/12
[52] U.S. Cl. ................................. 134/1.3; 134/19
[58] Field of Search .................................. 134/1, 139, 19, 134/2, 1.3

[56] References Cited

U.S. PATENT DOCUMENTS

| | | | |
|---|---|---|---|
| 4,079,522 | 3/1978 | Ham | 34/1 |
| 4,169,807 | 10/1979 | Zuber | 252/171 |
| 4,643,774 | 2/1987 | Kishida et al. | 134/1 |
| 4,722,752 | 2/1988 | Steck | 134/25.4 |
| 4,736,759 | 4/1988 | Coberly et al. | 134/66 |
| 4,778,532 | 10/1988 | McConnell et al. | 134/10 |
| 4,816,081 | 3/1989 | Mehta et al. | 134/30 |
| 4,902,350 | 2/1990 | Steck | 134/1 |
| 4,911,761 | 3/1990 | McConnell et al. | 134/11 |
| 4,984,597 | 1/1991 | McConnell et al. | 134/95 |
| 5,017,236 | 5/1991 | Moxness et al. | 134/1 |
| 5,071,488 | 12/1991 | Takayama et al. | 134/34 |
| 5,090,432 | 2/1992 | Bran | 134/2 |
| 5,129,955 | 7/1992 | Tanaka | 134/2 |
| 5,143,103 | 9/1992 | Basso et al. | 134/1 |
| 5,169,408 | 12/1992 | Biggerstaff et al. | 29/25.01 |
| 5,203,927 | 4/1993 | Yoshida et al. | 134/21 |

OTHER PUBLICATIONS

Koppenbrink, et al. "Particle Reduction on Silicon Wafers As A Result Of Isopropyl Alcohol Vapor Displacement Drying After Wet Processing", pp. 235–243. Dec. 1986.

*Primary Examiner*—Scott Kastler
*Attorney, Agent, or Firm*—Knobbe, Martens, Olson & Bear

[57] ABSTRACT

A method for drying semiconductor wafers produces ultra-clean wafers without conventional drying chemicals. The method involves slowing draining a rinsing fluid from a processing tank while heating the wafer at the fluid interface as the wafer emerges from the rinsing fluid. The portion of the wafer surface at the fluid interface is heated to a temperature greater than the rinsing fluid to drive contaminant particles away from the wafer surface. An apparatus for performing this drying method also is provided.

6 Claims, 4 Drawing Sheets

METHOD AND APPARATUS FOR DRYING SEMICONDUCTOR WAFERS

BACKGROUND OF THE INVENTION

1. Field of the Invention

The present invention relates to the processing of semiconductor wafers or similar items, and more specifically, to the drying of semiconductor wafers after fluid treatment.

2. Description of Related Art

The production of semiconductors commonly involves several process steps in which wafers are submerged in fluids. For instance, wafers generally undergo etching and cleansing steps during fabrication. Such processes generally are performed in fluid baths (e.g., baths of etching solutions or cleaning solutions) that are applied to the wafers in a tank, or into which the wafers are dipped. Although many techniques are employed to keep contaminants out of the fluid baths and to remove particulates from the baths, particulate contaminants in the baths continue to be a problem.

Through surface tension and other forces, such particles are easily transferred to the wafer surface when withdrawing the wafers from the fluid baths or draining the fluid from the tank. Particles deposited onto the wafer surface contaminate the wafer and detrimentally affect the electrical proficiency of the microscopic electrical circuitry on the wafer surface. This is especially true as integrated circuits became smaller and the size and number of such particles becomes more critical.

During conventional wafer fabrication, wafers are dried following fluid processing. Prior drying processes have involved a variety of different techniques including, for example, centrifugal drying (i.e., spin drying), evaporation drying and chemical drying. U.S. Pat. Nos. 4,079,522, 4,902,350; 5,071,488 and 5,090,432 disclose examples of prior evaporation drying methods. U.S. Pat. Nos. 4,991,761 and 4,984,597 disclose examples of prior chemical drying methods.

Prior drying processes suffer from a number of drawbacks. For example, evaporation drying tends to leave streaks and spots of residue from the processing fluids and other contaminants on the wafer surface as the wafer emerges from the process fluid. Centrifugal drying subjects the wafers to mechanical stresses and tends to produce static charges on the wafer surfaces which attract air borne contaminants. Prior chemical drying methods usually consume large volumes of chemicals (which increases production costs) and produce large volumes of chemical waste. The produced chemical waste poses safety and disposal concerns. And, in general, prior drying processes fail to produce ultra-clean wafers with minimal levels of particle contaminants and chemical residue (i.e., contaminant levels below 0.003 particles/$CM^2$ of 0.2 microns or greater).

SUMMARY OF THE INVENTION

A need therefore exists for a drying process for use with fluid treatment processes for wafers which yields a processed wafer with less particulate contaminants on the wafers surfaces than obtained by prior drying processes. Applicants have also recognized a need to eliminates hazardous chemicals and dangerous procedures (e.g., heating process fluids) from the drying process.

In accordance with an aspect of the present invention, rinsing or other process fluid is slowly removed from the surfaces of a semiconductor wafer, while heating portions of the wafer surfaces which are in contact with a fluid interface between the rinsing fluid and air or other dry gas or process fluid which replaces it. A rate of displacement of the rinsing fluid from the wafer surfaces is preferably no faster than about 7 or 8 centimeters per minute. The wafer at the fluid interface is heated to a temperature greater than a temperature of the rinsing fluid. It is desirable to heat the wafer to a sufficient temperature to produce convection currents in the first process fluid, flowing away from the heated surfaces of the wafer.

In accordance with a further aspect of the present invention, a system for processing a semiconductor wafer includes a processing container. The container has a pair of walls spaced so as to receive at least one wafer and a first process fluid therebetween. Heating elements are positioned to heat at least one side of the wafer. The container walls and the fluid in the container are transparent to the heat energy while the wafer absorbs the heat. The simplest approach is to heat the entire wafer continuously. The heat absorbed by the wafer is quickly conducted to the liquid in which it is immersed, while the emerging portion heats to a higher temperature. Alternatively, a controller may be connected to the heating elements to selectively energize particular heating elements to heat only a select portion of the wafer at a time. The invention further includes the method of using such apparatus to dry the wafer by only heating the wafer at a moving interface between a rinsing fluid and a dry gas replacing it. A bank of quartz halogen lamps on each side of the wafer are practical heating elements, although other arrangements may be employed.

BRIEF DESCRIPTION OF THE DRAWINGS

These and other features of the invention will now be described in detail with reference to the drawings of a preferred embodiment, which is intended to illustrate, and not to limit the invention, and in which.

DETAILED DESCRIPTION OF THE INVENTION

Figure 1:
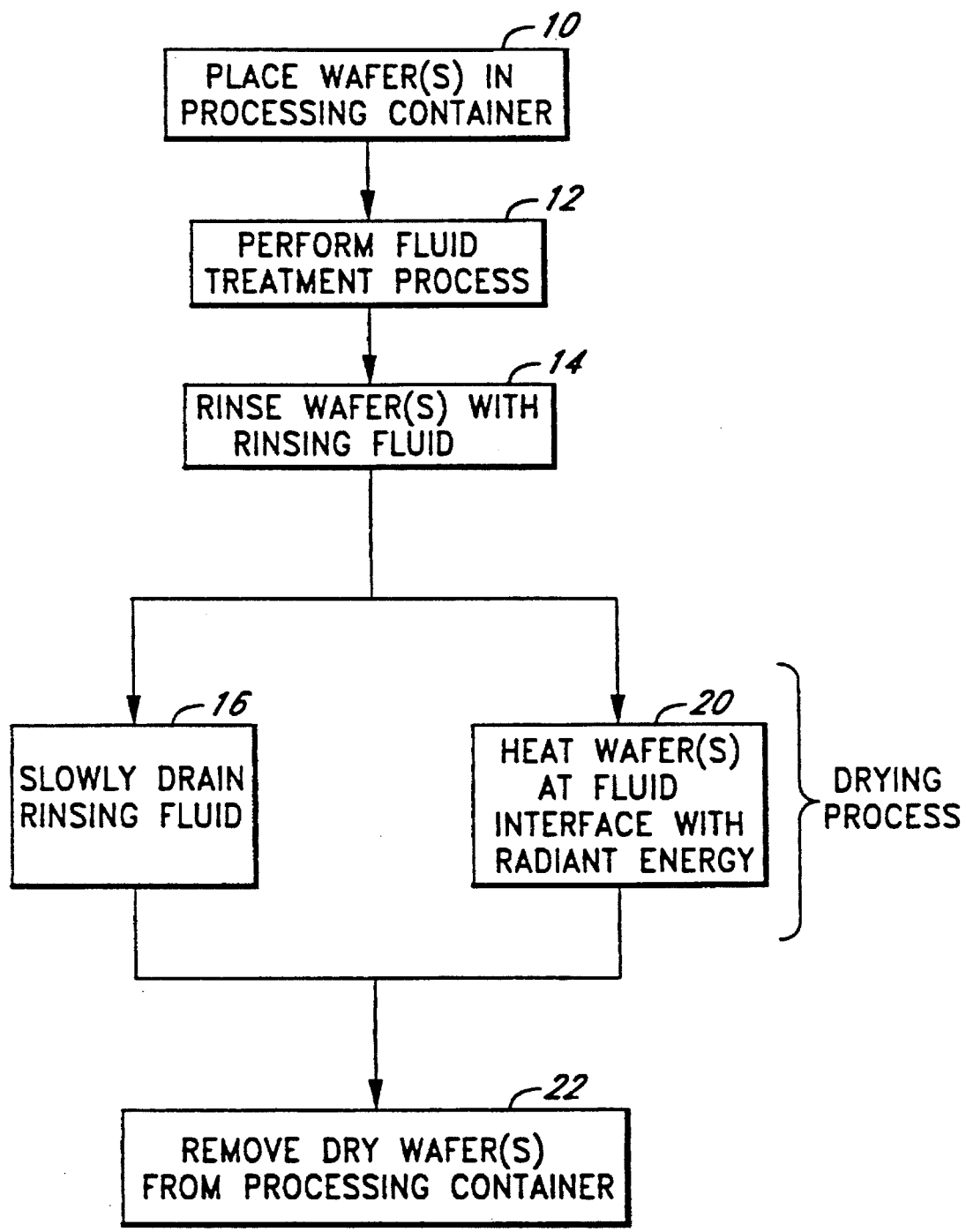
FIG. 1 is a generalized diagram illustrating the processing steps of a fluid treatment method incorporating a preferred drying method in accordance with the present invention.

FIG. 1 illustrates the basic steps of a semiconductor wafer drying method in accordance with one aspect of the present invention. Though the drying process of the present invention is described in reference to a fluid treatment involved with semiconductor fabrication, those skilled in the art can readily adapt the present drying method to other applications.

Silicon wafers generally undergo several fluid treatment steps during conventional semiconductor fabrication. For instance, the wafers are usually exposed to etching treatments, photo-resistent treatments, and cleansing treatments during fabrication. The present drying method thus is described in reference to a generic fluid treatment process with the understanding that the process can be adapted for use with any of the various fluid treatment steps involved in semiconductor wafer fabrication.

With reference to FIG. 1, at least one wafer is placed in a processing container, as represented in operation block 10, to begin the fluid treatment process. Process fluid is introduced into the container to fill the processing container to perform the fluid treatment process, as generally represented in operation block 12. For example, when cleaning the wafer(s), a cleaning solution flows into the tank to submerge the wafer(s). The washing of the wafer(s) can be accomplished in various conventional ways including continuously flowing cleaning solution over the wafer(s) and/or using sonic energy to agitate the cleaning solution surrounding the wafer(s) in the processing container.

The wafer(s) is usually rinsed after each treatment, as represented in operation block 14, to remove the treatment process fluids (e.g., etching solutions, cleaning solutions, etc.). Such rinsing processes can involve the use of several rinsing fluids and usually involve several rinsing cycles. The last rinsing cycle commonly uses deionized water to rinse the wafer(s).

The rinsing fluid flows continuously over the wafer(s) to rinse the wafer(s). Sonic energy can also be used during some portions of the rinsing process to enhance contaminant removal, as discussed in U.S. Pat. No. 5,090,432, which is hereby incorporated by reference.

In the illustrated embodiment, the rinsing process occurs in the same processing container that the fluid treatment process occurred. Potential damage associated with the transportation of the wafer(s) from one processing container to another thus is avoided. Additionally, exposure to the clean room atmosphere is eliminated to prevent possible contamination by airborne particles. It is understood, however, that the present drying method can be used with a fluid treatment process using several processing containers.

At the end of the conventional rinsing process, rinsing fluid (e.g., deionized water) remains in the processing container. To perform the drying process, the rinsing fluid is drained from the processing container, as represented in operation block 16.

The rate at which the rinsing fluid drains from the container should be controlled so that the wafer(s) emerges slowly from the rinsing fluid. If the drain rate is too fast, the rinsing fluid may leave residue streaks and spots. It has been found that a drain rate of the rinsing fluid over the side surfaces of the wafer(s) of no more than about 7 or 8 cm./min. is satisfactory, with the best results being obtain with a drain rate of about 5 cm./min.

A replacement fluid fills the container as the rinsing fluid drains from the container, as represented in operation block 18. A boundary layer or interface forms between the rinsing fluid and the drying fluid. The fluid interface travels downwardly, over the surface of the wafer(s), as the rinsing fluid drains from the container.

The replacement fluid desirably is an ultra-pure, dry gas which is non-reactive with the wafer and the rinsing fluid. A variety of dry gases, such as, for example, filtered air, nitrogen, argon and carbon dioxide can be used with equal results. Filtered air, however, normally fills the container when the container is opened to the clean room atmosphere, and, thus, the use of filtered air as the replacement fluid does not require special tanks, delivery systems and exhaust systems. Air also does not pose safety or health concerns. No matter the type, the dry gas fluid preferably is at room temperature to reduce production costs and to eliminate a potential source of danger (i.e., heating the fluid).

As represented by operation block 20 of FIG. 1, the drying process of the invention also involves simultaneously heating the wafer(s) while the rinsing fluid drains from the processing container. It is preferred that at least the portion of the wafer(s) which is in contact with the fluid interface (i.e., the phase boundary layer between the rinsing fluid and the replacement fluid) should be heated above the ambient temperature of the rinsing fluid within the processing container. A wafer temperature of 80° C. to 100° C. at the interface, when used with a conventional rinsing process where the overall temperature of the rinsing fluid is about room temperature, has been found to produce satisfactory results.

Once the drying process is complete, the wafer(s) is removed from the processing container by conventional means. Operation block 22 represents this general final process step.

The drying process diagrammed by FIG. 1 produces a dry, ultra-clean wafer(s) after the fluid treatment process. As discussed in detail below, tests show that this drying process yields a very significant reduction in the number of particles on the wafer after the drying process. The drying process also does not use any chemicals, nor require heating of the rinsing or drying fluids. The drying process also is desirably performed in the same processing container as the fluid treatment and rinsing processes.

Figure 2:
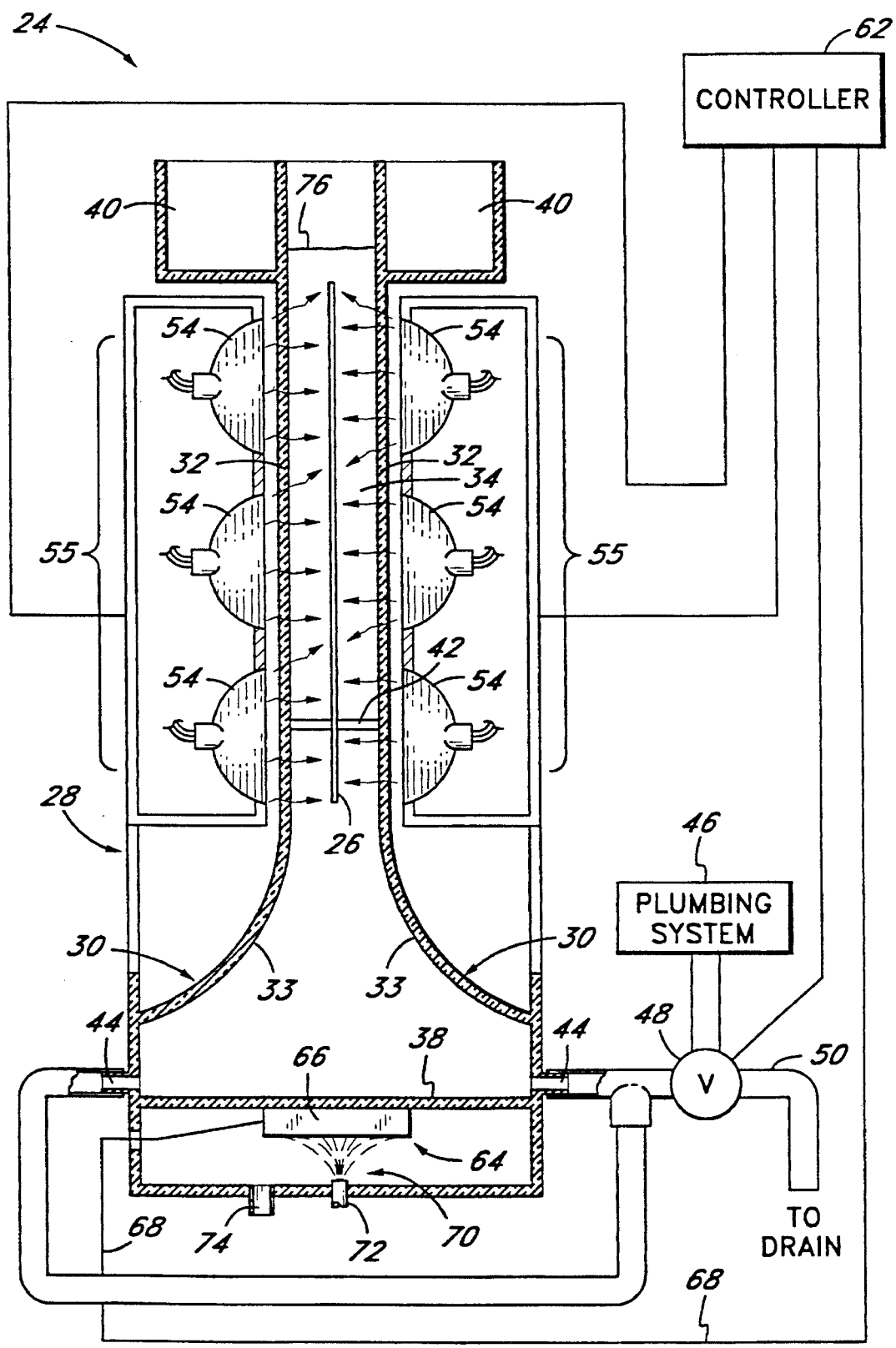
FIG. 2 is a schematic, cross-sectional, side elevational view of a wafer processing system in accordance with a preferred embodiment of the present invention.
Figure 3:
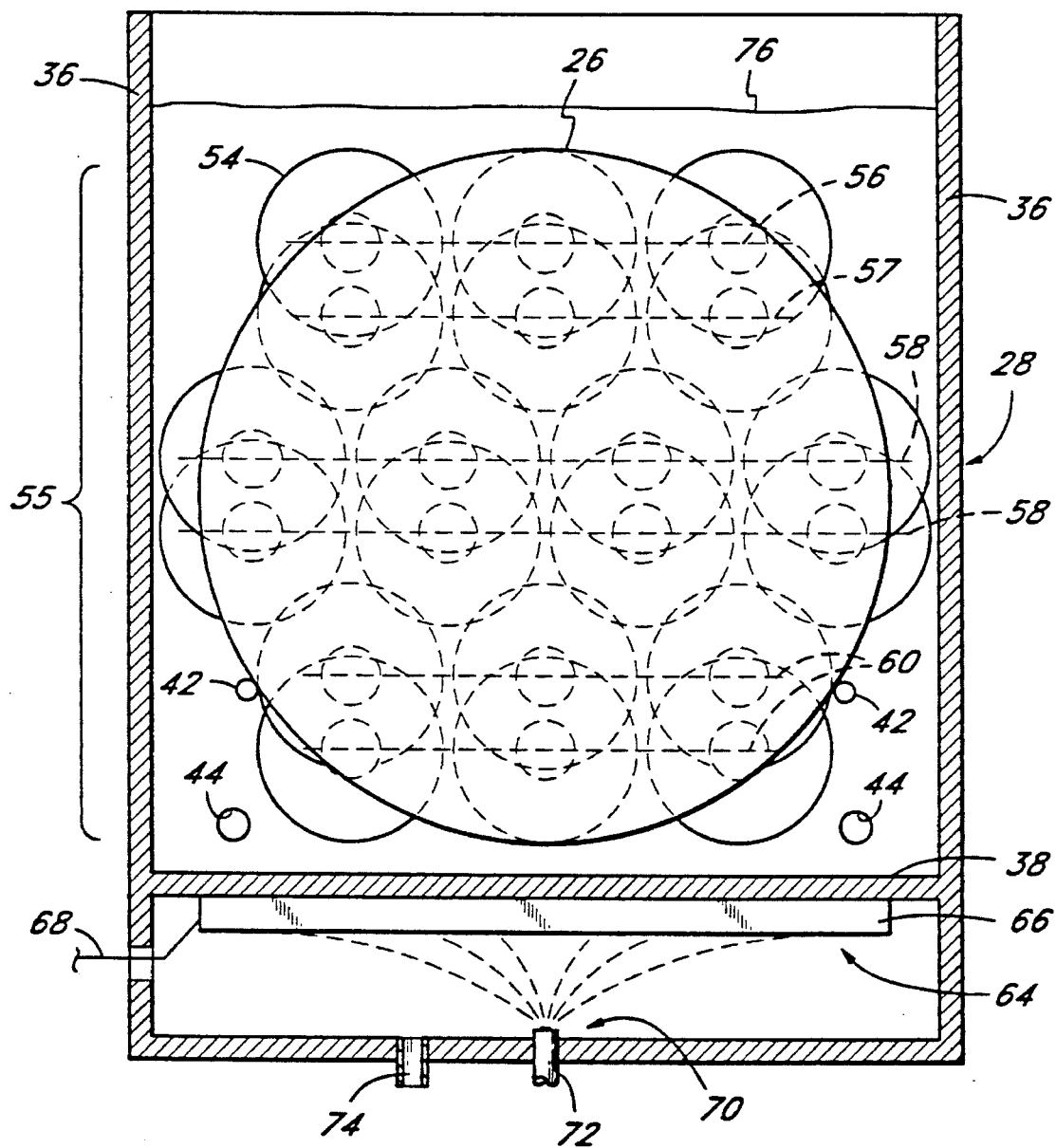
FIG. 3 is a schematic, cross-sectional, front elevational view of the wafer processing container of FIG. 2.

In this regard, in accordance with another aspect of the present invention, there is provided a processing system 24, as seen in FIGS. 2 and 3, for drying semiconductor wafers 26 after fluid treatment. The processing system 24 is capable of performing fluid treatment, rinsing and drying processes all in the same container, as discussed below.

FIG. 2 illustrates a processing container 28 of the processing system 24. The processing container 28 is configured generally in accordance with the teachings of U.S. Pat. No. 5,090,432.

The processing container 28 generally has a horn-like profile. That is, from the side view as shown in FIG. 2, the container 28 has a pair of sidewalls 30 having generally parallel, upstanding vertical portions 32 which preferably flare outwardly in a parabolic shape towards the bottom of container 28 to from a horn portion 33 of the container 28. Having the side walls flare outwardly with flat wall sections instead of curved is a satisfactory compromise. The vertical sections 32 of the sidewalls 30 define a generally rectangular, narrow, vertically oriented chamber 34. This horn-like construction of the container 28 intensifies in the chamber 34 the effect of megasonic (ultra-high frequency) energy which desirably is used with the processing system 24 and is discussed below. The specially constructed processing container 28 ensures that both surfaces of the wafer 26 are uniformly subjected to the produced sonic energy.

With reference to FIGS. 2 and 3, the sidewalls 30 stand slightly taller than the diameter of the wafer 26 when the wafer 26 is positioned within the container 28. The sidewalls 30 also have a width (i.e., the distance between the ends), as best seen in FIG. 3, that is wider than the diameter of the wafer 10. As seen in FIG. 2, the spacing between the vertical sections 32 of the sidewalls 30 is greater than the thickness of the wafer 10, but desirably is only slightly wider. In an exemplary embodiment, the distance between the sidewalls 10 measures between 1 and 2 cm. This configuration of the sidewalls 30 produces a chamber 34 of sufficient size to completely immerse the wafer 10 in a process fluid contained therein. At the same time, the close spacing of the walls 30 around the wafer 10 minimizes the volume of costly process fluids involved in the particular wafer fluid treatment process.

With reference to FIG. 3, the container 28 also includes a pair of ends 36 and a bottom 38. The ends 36, sidewalls 30 and bottom 38 are joined to form a fluid-tight tank. It is contemplated, however, that the container 28 could be formed in the alternative as an enclosed vessel.

As best seen in FIG. 2, the container 28 desirably includes a pair of weirs 40. The weirs 40 are located at the top of the container 28, adjacent to each sidewall 30. The weirs 40 catch fluids which overflow the processing container 28, as discussed below.

As seen in FIGS. 2 and 3, the container 28 includes a pair of spaced wafer supports 42 that extend between the parallel vertical surfaces 32 of the sidewalls 30 proximate to the horn section 33 of the container 28. The supports 42 are suitably formed to engage and to support a single disk-shaped wafer 26 positioned within the container 28. The wafer 26 desirably sits within the chamber 34, centrally positioned between the sidewalls 30. The wafer 26 desirably does not contact the sidewalls 30. Also, the lower edge of the wafer 26 is spaced from the container bottom 38.

The container 28 is made of a durable material which is non-reactive with the process fluids contained within the container 28. The material that forms at least the sidewalls 30 of the container 28 desirably is generally transparent to the radiant energy used to dry the wafer 26 as described below. That is, the radiant energy will pass through the sidewalls 30 of the container 28. Such transparent materials include polished transparent quartz and sapphire.

With reference to FIGS. 2 and 3, the container 28 includes at least one port 44 through which process fluid is introduced and/or drains. In the exemplary embodiment, the container 28 includes four ports 44, one port at each end of each sidewall 30. The ports 44 are positioned near the bottom 38 of the container 28. A conventional plumbing system (which is schematically illustrated and referenced by reference numeral 46) feeds at least one process fluid into a control valve 48 located outside the container 28.

In the illustrated embodiment, the valve 48 is a three-way valve which has three positions to establish three fluid routing conditions. When positioned in a first position, the valve 48 allows process fluid from the plumbing system 46 to enter the container 28 through the container ports 44. In a second position, the valve 48 directs process fluid from the container 28 to a drain line 50. In a third position, the valve 48 is closed and prohibits influent or effluent flow of the process fluid.

With reference to FIG. 2, the processing container 28 desirably includes heating elements 54, which are activated during the drying process described below. The heating elements 54 desirably produce radiant energy, preferably in the form of electromagnetic energy, which passes through the sidewalls 30 of the container 28 as well as though the rinsing fluid, and is absorbed by the wafer 26. In the exemplary embodiment, the heating elements 54 produce light. Though the light may have a wavelength in the infrared, visible or ultraviolet spectrums, it is preferred that the produced light be visible light because of safety concerns.

In the illustrated embodiment, the heating elements 54 are commercially available quartz halogen lamps with dichroic mirrors. The lamps 54 desirably are arranged to direct radiant energy over the entire surface area of both sides of the wafer 26.

FIG. 3 illustrates a preferred light bank arrangement 55 for the lamps 54 on either side of the container 28. The arrangement of the lamp banks 55 on both sides of the container 28 are substantially identical, except that the lamps on one side are preferably vertically offset with those of the other side. This provides more uniform heating of the wafer. The lamps in FIG. 2 are shown aligned rather than offset, to indicate that either approach may be used. The lamps 54 are arranged in a plurality of rows. In the illustrated embodiment, the lamps 54 are arranged in three rows. The first rows 56 consist of three lamps 54, the second rows 58 consist of four lamps 54, and the third rows 60 consist of three lamps 54. The lamps 54 desirably have a wattage ranging between about 20 to about 30 watts per lamp 54 for use in the described bank arrangement 55 and with the container 28 described above.

With reference to FIG. 2, a controller 62 desirably coordinates the operation of the heating elements 54 and the control valve 48 which regulates the effluent flow of process fluid from the processing container 28. For this purpose, the controller 62 either communicates with the control valve 48 to sense the flow rate of fluid through the valve 48, or is preprogrammed (using mechanical, analog or digital technology) with the flow rate at which the control valve 48 is set. The controller 62 also controls the distribution of power to the heating elements 54 to selectively activate the heating elements 54, as described below.

The processing container 28 desirably is used in conjunction with a megasonic energy (i.e., ultra high frequency) cleaning system 64. In the exemplary embodiment illustrated in FIG. 2, the megasonic energy cleaning system 64 includes at least one a piezoelectric transducer 66. The transducer 66 is mounted to the bottom 38 of the processing container 28 so as to direct megasonic energy into the container 28. Although the transducer 66 is illustrated as a conventional flat transducer, it should be understood that other known transducers, such as, for example, a diverging type of transducer as described in U.S. Pat. No. 5,037,481, which is hereby incorporated by reference, can be used as well. A power line 68 connects the transducer 66 to a source of electrical power (not shown) via the controller 62 to energize the transducer 66. The power line 68 extends through one of the sidewalls 30 of the container 28.

With reference to FIG. 2, the megasonic cleaning system 64 also desirably includes a conventional cooling system 70 mounted beneath the transducer 66. The cooling system 70 includes at least one nozzle 72 which sprays coolant on the operating transducer 66 and a drain 74 through which the spent coolant is disposed.

Figure 4:
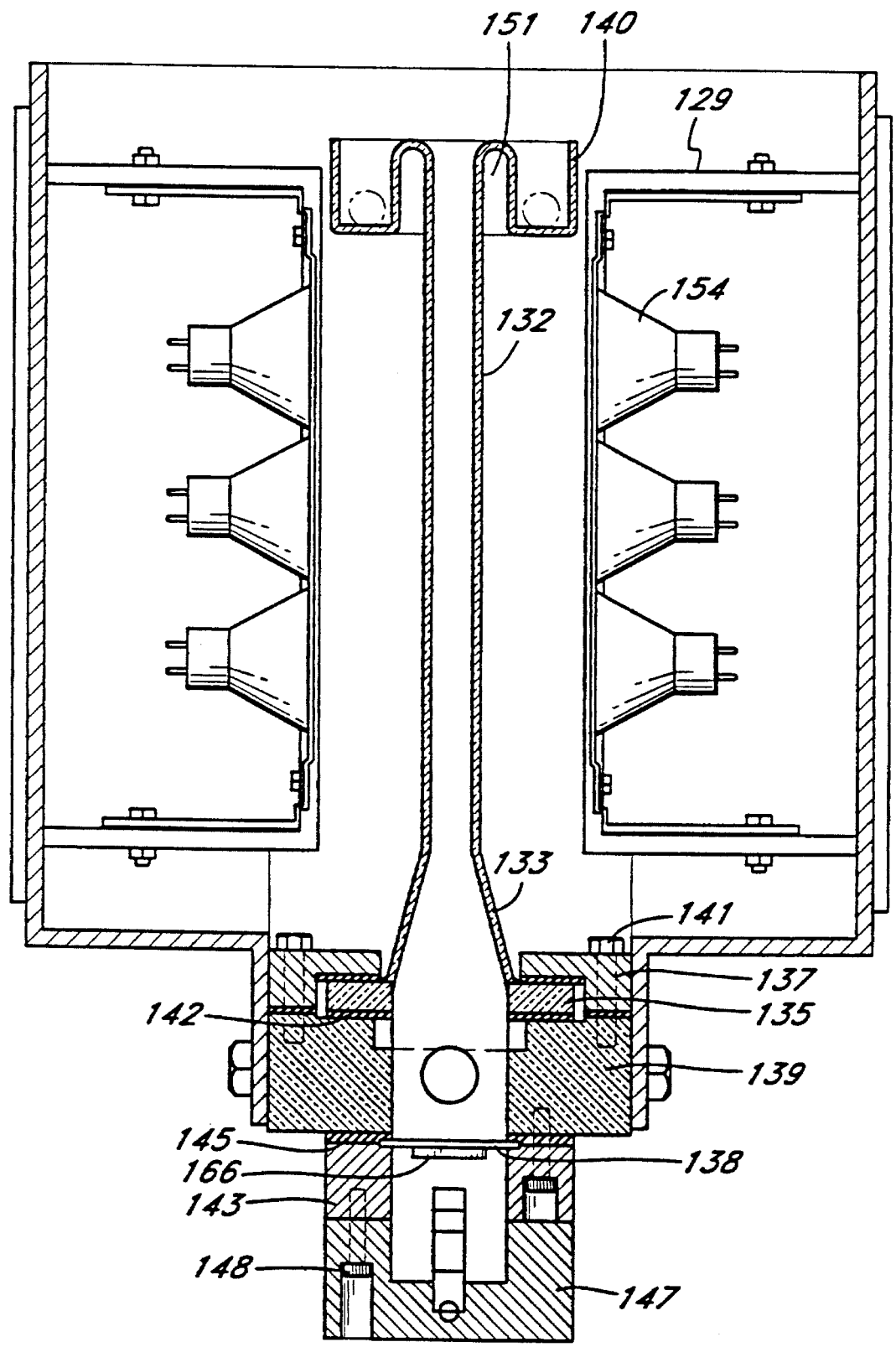
FIG. 4 is a somewhat schematic, cross-sectional side view of a prototype form of the wafer processing system.

The system shown in FIGS. 2 and 3 illustrates the concept of the invention. However, the prototype apparatus utilized for the experiments discussed below was slightly different than as illustrated in FIG. 4. As can be seen, the heater lights 154 positioned on each side of the vertical walls 132 of the container 128 are mounted in separate housings 129 that are separate from the container walls 32. These housings are preferably made of suitable plastic, which is considerably less expensive than the preferably quartz processing chamber walls 132.

The lower ends of the vertical walls 132 are joined to outwardly diverging flat walls 133. Although representing a compromise, these flat walls are less expensive to fabricate than the curved walls 33 of FIG. 2. The lower ends of the flat walls 133 surround an opening formed in an elongated plate 135 and are welded to the plate. The periphery of the plate 135 is mounted or clamped between an upper clamp 137 and a lower clamp or base 139 with suitable gaskets 142 extending between the quartz plate and the clamps. Suitable bolts 141 connect the clamping members. These clamping members may be made of a suitable plastic such that they can be joined by bolts or other such fasteners, whereas it is not practical to connect quartz components in that fashion. As can be seen, the lamp housings 129 are conveniently mounted to the plastic base clamp 139 forming the lower portion of the container.

A bottom wall 138 of the container is also made of quartz and is in the form of a separate plate that is clamped to the base 139 by lower housing member 143 together with a suitable gasket 145. A transducer 166 is coupled, preferably bonded, to the quartz plate 138. A housing for the transducer is completed by a lower housing member 147 joined by suitable fasteners 148 to the upper member 145.

A weir 140 is formed at the upper end of the container walls 32 and is constructed slightly different from the one illustrated in FIG. 2. The weir is actually joined to the upper ends of the vertical walls 132, and a gap 151 exists between the weir and the upper portion of the container vertical wall. Providing the gap prevents overflow liquid from flowing directly on to the exterior of the upper portion of the container walls. It has been found that megasonic energy can escape through the quartz walls into such overflow liquid. The air gap, however, between the weir and the upper wall of the container prevents such energy escape. This is only of significance to the extent that an upper portion of a wafer extends into that upper area of the container. Of course, if there were no weir, the overflow liquid could flow completely down the exterior sides of the container, and this would result in undesirable energy loss, resulting in reduced agitation of the liquid in the container.

Operation

The operation of the processing system 24 is now described in reference to a wafer cleansing process for illustrative purposes only, and without limiting the invention in any way. It should be understood, however, that the processing system 24 can be used with a variety of other fluid treatments for semiconductor wafers 26 (e.g., etching, photo-resistant stripping, etc.) as well.

To begin the cleansing process, cleaning solution enters the processing container 28 through the ports 44 at the bottom 38 of the container 28. Specifically, the controller 62 instructs the valve 48 to open to the first position to allow cleaning solution to flow from the plumbing system 46 into the container 28. The cleaning solution flows into the container 28 to completely fill the container 28. The controller 62 may switch the control valve 48 to the third position once the cleaning fluid fills the container 28.

The controller 62 activates the transducer 66, via the power supply line 68, to rigorously vibrate the cleaning solution over the surfaces of the wafer 26. That is, the operating transducer 66 transmits vibrational energy through the bottom 38 of the processing container 28 and into the container 28. The transmitted vibrational energy is directed primarily in the vertical direction.

The chamber 34 formed inside the processing container 28 captures much of the oscillatory energy produced by the transducer 66. The converging walls of the container 28 cause reflections of the vibrational energy produced by the transducer 66 such that the energy is funneled into the upwardly extending chamber 34.

The cleaning fluid may continue to flow through the processing container 28 with the transducer 66 activated. The flow of cleaning fluid over the top of the processing container 28 spills into the weirs 40. A drainage system (not shown) disposes the overflow fluid, as known in the art. The system includes a sensor to deenergize the transducer 66 if liquid level in the container reaches a minimum level.

When the cleaning process is complete, the controller 62 switches the control valve 48 to its first position to allow a rinsing fluid, such as deionized water, to flow from the plumbing system 46 into the container ports 44. The rinsing fluid displaces the cleaning fluid in the processing container 28 to cause the cleaning fluid to overflow the top of the container 28 into the weirs 40.

Because the rinsing fluid displaces the cleaning fluid in the processing container 28, the wafer 26 need not be transported from tank to tank during these processes. Potential damage associated with wafer transport between processing tanks thus is avoided. Contamination due to exposure to the atmosphere of the clean room, which previously occurred during transport between baths, also is eliminated. Less mechanical equipment also is necessary in the clean room, which reduces the number of contaminants present in the clean room.

The controller 62 switches the control valve 48 to the third position once the rinsing fluid completely replaces the cleaning fluid. The controller 62 may then activate the megasonic energy cleaning system 70 to provide the benefits of megasonic vibrational cleaning during the rinse cycle. The megasonic energy cleaning system 70 also may remain activated during the fluid replacement step.

The controller 62 opens the control valve 48 to introduce more rinsing fluid into the bottom of the container 28 to flush contaminants from the container 28 after the megasonic energy acts upon the wafer 26 submerged in the rinsing fluid. The displaced contaminants carried by rinsing fluid flow over the top of the container 28 into the weirs 40. Several rinsing cycles may be executed to ensure the purity of the surfaces of the wafer 26.

Upon completion of the rinsing process, the wafer 26 is dried by the above described drying method as adapted to the present processing system 24. The controller 62 opens the control valve 48 to its second position so that the rinsing fluid flows from the container 28 through the ports 44 and to the drain 50. The controller desirably sets the flow rate through the valve 48 such that the rinsing fluid within the chamber 34 of the container 28 drains at a rate no more than about 7 or 8 cm./minute. The controller 54 also desirably de-energizes the megasonic energy cleaning system 64 during the drying process.

A replacement fluid enters into the top of the container 28 to displace the rinsing fluid within the chamber 34. In the illustrated embodiment, the top of the container 28 is open to the atmosphere. Filtered air from the clean room thus fills the container 28 as the rinsing fluid drains. It is contemplated, however, that the top of the container 28 may be closed or sealed to the atmosphere and a gas (e.g., nitrogen) be introduced into the container 28, preferably at the top, via a conventional delivery system.

The multiple row lamp banks 55 selectively heat sections on both sides of the wafer 26. For this purpose, the controller 62 controls the operation of the lamp banks 55. That is, the controller 62 controls the power distribution to the lamps 54.

The controller 62 lights (i.e., energizes) only the top row of lamps 56 to heat the top section of the wafer 26 when the rinsing fluid initially drains from the container 28. As a rinsing fluid/replacement fluid interface 76 (see FIG. 2) travels over the side surfaces of the wafer 26 toward the center section of the wafer 26, the controller 62 energizes the middle row of lamps 58 to heat the wafer center section. The controller 62 also can dim or remove power to the top lamp row 56 when the rinsing fluid/replacement fluid interface 76 approaches the center of the wafer 26.

In a like manner, the controller 62 lights the bottom row of lamps 60 as the rinsing fluid drains below the middle section of the wafer 26. The bottom row 60 heats the lower section of the wafer 26. The controller 62 also can dim or cut power to the middle row of lamps 58 when the fluid interface 76 passes below the middle lamp row 58. The controller 62 cuts power to the lower lamp row 60 after the fluid interface 76 drains below the wafer 26.

If desired, all of the lamps may be energized at one time, although the temperature differential at the interface is believed to be the important consideration. Energizing all lamps at one time is simpler from a control standpoint.

The wafer 26 can be removed from the processing tank after the rinsing fluid drains from the chamber 34 of the container 28. The processed wafer 26 is substantially dry and ultra-clean.

The above described drying method can be adapted for use with other types of wafer processing apparatus (e.g., multiple wafer processing systems), and the description herein of a single wafer processing system should not in any way be limiting the scope of the claimed invention. Also, a single large lamp can be used on each side of the wafer instead of a group of smaller lamps. One advantage of the group of smaller lamps is that they do not extend away from the wafer as far as a large lamp.

In one example of the cleaning and drying capabilities of the above system using a single large lamp on each side, several silicon wafers were cleaned and dried using the method of the invention. Each wafer initially had a heavy particle count of approximately six particles per square centimeter ($cm^2$) of 0.2 microns or greater.

The rinsing fluid, deionized water, in the processing chamber was initially at typical room temperature Consequently, the submerged wafer was at the same temperature. The air which replaced the rinsing fluid as it was drained was also approximately at typical room air temperature.

The rinsing fluid was drained from the container 28 at a rate of about 5 cm/min over the vertically oriented surfaces of the wafer. The wafer was heated by radiation energy emitted by two large lamps of about 250 watts each, energized throughout the drying operation. As the wafer was heated and the rinsing fluid drained from the container, the temperature of the wafer increased, but the heat from the portion of the wafer which was in the rinsing liquid was transferred to the rinsing liquid. The temperature of the wafer at the upper surface of the liquid and the temperature of the portion of the wafer above the liquid increased significantly. After drying, the processed wafers had a greatly reduced particle count due to the cleaning and the in situ drying did not appreciably increase the count. This determined by comparing particle count after drying with that obtained by similar cleaning but with drying by drying in a commercial spin dryer. In situ drying of course has many advantages.

Tests have also been performed to evaluate the drying capability without any cleaning aspect, and thus to obtain a more direct indication of the drying process. Wafers that were initially quite clean were immersed in clean deionized, room temperature water. The water was then drained from the container at the preferred drain rate of about 5 cm/min. As the water drained, "clean-room" air at typical room temperature filled the space above the receding water level. No heat was applied to the wafer as the water drained. The particles on the wafer were then measured, and it was found that the particle count had greatly increased the clean wafer count. These disappointing results indicate the difficulties of drying clean wafers after they are removed from clean rinsing fluid. These results also indicate that merely removing the rinsing fluid slowly but without heating does not provide satisfactory results.

In further tests, the same procedure was followed except that the wafers were heated as the rinsing fluid was withdrawn and the rate at which the liquid was withdrawn was doubled to about ten cm/min. Clean wafers immersed in clean deionized, room temperature water were heated throughout the process with wattage of about 250. The particle count of the dry wafers greatly increased. From this test it is theorized that even though the heat may initiate a desired particle movement away from the wafer, the effect is not sufficiently significant, because the wafer is removed so quickly and the surface of the wafer emerging from the liquid is probably not dry. Thus, it appears that the remaining liquid on the wafer, as it emerges, evaporates, leaving particles on the wafer.

Finally, according to the preferred steps of the present invention, a clean wafer was immersed in clean deionized water, and the water was then drained at a rate of approximately 5 cm/min while the wafer was heated throughout the liquid draining process. The clean wafers were able to be dried without a significant increase in particle count, in stark contrast to the greatly increased particle count of the other tests.

In summary, initial tests illustrate the stellar results of the drying process of the present invention. Heating the wafer, with a fast drain rate yielded an undesirable, much higher particle count than the present drying process. Similarly, slow draining without heating also yielded an unacceptably higher level particle count. It thus is believed that the simultaneous steps of heating the wafer at the fluid interface above the temperature of the rinsing fluid and slowly draining the rinsing fluid contributes to the obtained level of wafer purity.

The wafer, heated at the fluid interface by absorbing the radiant energy emitted by heating elements, transfers heat, at least in part through convection, into the surrounding rinsing fluid. Without limiting the invention in any way, it is thought that this heat transfer through convection produces convection currents in the rinsing fluid away from the heated wafer. It is thought that the convection currents carry particulate contaminants away from the wafer surface as the rinsing fluid drains from the surface. The temperature differential at the interface may also produce helpful surface tension effects. It is believed that without heating the wafer, the convection currents surface tension effects are not obtained. Moreover, the wafer is probably not dry as it emerges from the liquid-air interface. Similarly, it is believed that the wafer surface is not dry as it emerges from the liquid-air interface if the liquid is withdrawn too fast in relation to the rate of heating. Even though the heating presumably produced convection currents, the moisture remaining on the wafer as the liquid recedes must still contain a significant number of particles.

The present drying method improves drying efficiency and results in semiconductor wafers having less particulate contamination on the wafer surfaces than that achieved by conventional drying methods. The process in its preferred form also does not involve any chemicals, such as alcohol. Hence, the conventional delivery, disposal, safety and health concerns associated with the use of chemicals are avoided. The process fluids (i.e., the rinsing and drying fluids) further do not have to be heated, thus eliminating another source of potential danger and reducing the expense of wafer processing. Additionally, the wafer need not be transferred to a different location for drying. It should be noted however that the wafers can be lifted to be separated from the liquid, although draining the liquid is preferably since that is simpler, and lifting could produce containments.

Although the invention has been described in terms of certain preferred embodiments, other embodiments apparent to those skilled in the art are also within the scope of the resent invention. Accordingly, the scope of the invention is intended to be defined only by the claims which follow.

What is claimed is:

1. A method for drying a semiconductor wafer at the completion of cleaning or other liquid processing of the wafer which leaves the wafer immersed in rinse water, said method comprising the steps of:

draining the rinse water from the wafer;

simultaneously with said draining, heating the wafer at the interface between the water and a gas which replaces the water, the wafer portions at the interface being heated to a temperature greater than the temperature of the water; and continuing said draining and heating steps until said interface moves with respect to the wafer over essentially the entire surface of one side of the wafer;

wherein said draining is performed at a sufficiently slow rate such that the water on the wafer at said interface flows away from the wafer without evaporation from the wafer and the wafer emerges from the water with substantially no water on the heated surface of the wafer exposed to the gas.

2. The method of claim 1, wherein said heating is provided by applying radiant energy.

3. The method of claim 2, wherein said applying of radiant energy includes heating said portions of the wafer at the interface to a sufficient temperature to produce convection currents in the liquid flowing away from the wafer.

4. The method of claim 1, wherein said heating is provided by radiant energy through a wall of a container in which the wafer and the liquid are positioned, said wall being substantially transparent to radiant energy.

5. The method of claim 1, wherein said draining proceeds at a rate no faster than about 8 cm per minute.

6. The method of claim 1, wherein said draining proceeds at a rate of about 5 cm per minute.

* * * * *